United States Patent
Srinidhi Embar et al.

(10) Patent No.: US 9,438,186 B2
(45) Date of Patent: Sep. 6, 2016

(54) POWER AMPLIFIER WITH ENVELOPE INJECTION

(71) Applicants: Ramanujam Srinidhi Embar, Gilbert, AZ (US); Abdulrhman M. S Ahmed, Gilbert, AZ (US); Roy McLaren, Chandler, AZ (US); Sarmad K. Musa, Gilbert, AZ (US); Joseph Staudinger, Gilbert, AZ (US)

(72) Inventors: Ramanujam Srinidhi Embar, Gilbert, AZ (US); Abdulrhman M. S Ahmed, Gilbert, AZ (US); Roy McLaren, Chandler, AZ (US); Sarmad K. Musa, Gilbert, AZ (US); Joseph Staudinger, Gilbert, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 38 days.

(21) Appl. No.: 14/266,451

(22) Filed: Apr. 30, 2014

(65) Prior Publication Data

US 2015/0318827 A1 Nov. 5, 2015

(51) Int. Cl.

| | | |
|---|---|---|
| H03G 3/20 | (2006.01) | |
| H03F 3/24 | (2006.01) | |
| H03F 3/21 | (2006.01) | |
| H03F 1/02 | (2006.01) | |
| H03F 3/195 | (2006.01) | |

(52) U.S. Cl.
CPC ............ *H03F 3/245* (2013.01); *H03F 1/0222* (2013.01); *H03F 1/0266* (2013.01); *H03F 1/0288* (2013.01); *H03F 3/195* (2013.01); *H03F 3/21* (2013.01); *H03F 3/211* (2013.01); *H03F 2200/102* (2013.01); *H03F 2200/405* (2013.01)

(58) Field of Classification Search
CPC .......... H03F 1/26; H03F 3/30; H03F 1/0222; H03F 1/0266; H03F 1/0288; H03F 3/21; H03F 3/211; H03F 3/195; H03F 3/245; H03F 2200/102; H03F 2200/405
USPC ........... 330/136, 149, 285, 36, 51, 137, 279, 330/296, 124 R; 332/144; 375/295–297; 455/63, 114.1, 114.3, 115.1, 120, 455/127.1, 127.2, 127.3, 127.4
See application file for complete search history.

(56) References Cited

U.S. PATENT DOCUMENTS 6,833,758 B2 * 12/2004 Matsuyoshi et al. .......... 330/149
7,843,262 B2 * 11/2010 Takenaka ...................... 330/136

OTHER PUBLICATIONS

AFT23H200-4S2L Datasheet, Freescale Semiconductor Technical Data, Document No. AFT23H200-4S2L Rev. 1, May 2013.*
Karla Smith, "Gate Bias Control and Harmonic Load Modulation for a Doherty Amplifier," Thesis, University of Canterbury, New Zealand, Sep. 2, 2009.

(Continued)

*Primary Examiner* — Steven J Mottola
*Assistant Examiner* — Hafizur Rahman

(57) ABSTRACT

A device and a method for an amplifier having reduced intermodulation (IM) distortion output products are presented. An amplifier has an output, and at least one of a gate bias input and a drain supply input. The amplifier is configured to receive an input signal and output an amplified signal at the output of the amplified. An input is configured to receive an envelope signal. The input is connected to the at least one of the gate bias input and the drain supply input and the envelope signal is at least partially determined by an attribute of the input signal to the amplifier. A controller is configured to modify at least one of an amplitude and a phase of the envelope signal to reduce a magnitude of an intermodulation distortion product of the amplifier.

19 Claims, 5 Drawing Sheets

(56) References Cited

OTHER PUBLICATIONS

Joel Vuolevi, Jani Manninen, Timo Rahkonen, "Memory Effects Compensation in RF Power Amplifiers by Using Envelope Injection Technique," Radio and Wireless Conference, RAWCON 2001, IEEE, pp. 257-260.

M. Akmal, J. Lees, S. Bensmida, S. Woodington, V. Carrubba, S. Cripps, J. Benedikt, K. Morris, M. Beach, J. McGehhan, P.J. Tasker, "The Effect of Baseband Impedance Termination on the Linerarity of GaN HEMTs," 40th European Microwave Conference, 2010 IEEE, pp. 1046-1049.

You-Jiang Liu; Rong Zeng; Tao Cao; Bang-Hua Zhou; Jie Zhou; Yi-Nong Liu, "Up-converted Dual-envelope Injection Enhanced Digital Predistortion for Inverse Class-E Power Amplifier Linearization," Microwave Integrated Circuits Conference (EDuMIC), 2011 European, pp. 280-283.

Leung et al., "Analysis of Envelope Signal Injection for Improvement of RF Amplifier Intermodulation Distortion," IEEE Journal of Solid-State Circuits, vol. 40, No. 9, Sep. 2005, pp. 1888-1894.

\* cited by examiner

POWER AMPLIFIER WITH ENVELOPE INJECTION

FIELD OF THE INVENTION

Embodiments of the inventive subject matter relate to an amplifier and more specifically to an amplifier having reduced intermodulation (IM) distortion output products.

BACKGROUND OF THE INVENTION

With the advent of new telecommunication systems, it can become increasingly difficult to provide power amplifiers that exhibit desired linearity characteristics. This may be particularly true for the amplifiers driving base stations in communications networks, where the network are operating as fifth generation or beyond fourth generation—long term evolution (LTE) networks.

In such applications, amplifiers that are more linear are more easily corrected using digital predistortion (DPD) techniques, further improving the amplifier's efficiency and potentially simplifying the overall amplifier implementation. A power amplifier's non-linearity can be attributed, at least in part, to a number of intrinsic nonlinearities occurring within the power transistors of the amplifier, such as variances in the transistor's gain, and gate-to-source and gate-to-drain capacitances.

One specific type of power amplifier used in wireless communication systems includes Doherty amplifiers. Doherty amplifiers can be suitable for use in such applications because the amplifiers include separate amplification paths—typically a carrier path and a peaking path. The two paths are configured to operate at different classes. More particularly, the carrier amplification path typically operates in a class AB mode and the peaking amplification path is biased such that it operates in a class C mode. This can enable improved power-added efficiency and linearity of the amplifier, as compared to a balanced amplifier, at the power levels commonly encountered in wireless communications applications.

BRIEF DESCRIPTION OF THE DRAWINGS

The accompanying figures, in which like reference numerals refer to identical or functionally similar elements throughout the separate views and which together with the detailed description below are incorporated in and form part of the specification, serve to further illustrate various embodiments and to explain various principles and advantages all in accordance with the present inventive subject matter.

DETAILED DESCRIPTION

In overview, the present disclosure describes embodiments of the inventive subject matter that relate to an amplifier and more specifically to an amplifier configured to produce signals with reduced intermodulation (IM) distortion output products.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the scope of the invention.

It is further understood that the use of relational terms, if any, such as first and second, top and bottom, and the like are used solely to distinguish one entity or action from another without necessarily requiring or implying any actual such relationship or order between such entities or actions.

Much of the inventive functionality and many of the inventive principles are best implemented with or in integrated circuits (ICs) including possibly application specific ICs or ICs with integrated processing or control or other structures. It is expected that one of ordinary skill, notwithstanding possibly significant effort and many design choices motivated by, for example, available time, current technology, and economic considerations, when guided by the concepts and principles disclosed herein will be readily capable of generating such ICs and structures with minimal experimentation. Therefore, in the interest of brevity and minimization of any risk of obscuring the principles and concepts according to below-described embodiments of the present invention, further discussion of such structures and ICs, if any, will be limited to the essentials with respect to the principles and concepts of the various embodiments.

Figure 1:
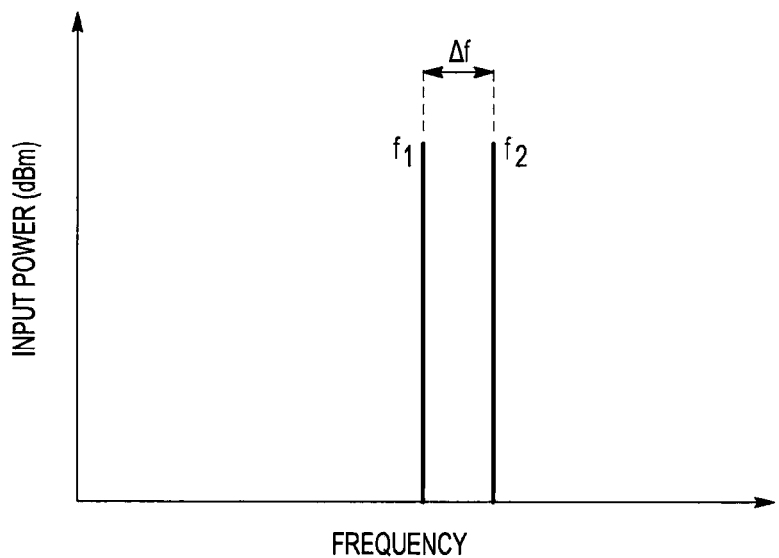
FIG. 1 is a graph showing the radio frequency (RF) power of an input two-tone sinusoidal signal against frequency in the frequency domain.

An input signal to a power amplifier of a communication system may take the form of a dual or two-tone linear radio frequency (RF) input. To illustrate, FIG. 1 shows the RF power of such an input signal against frequency in the frequency domain. As illustrated, in the two-tone input signal there are two energy peaks at the frequencies $f_1$ and $f_2$. The difference in frequency between $f_1$ and $f_2$ is illustrated by the value $\Delta f$.

When the two-tone RF input signal illustrated in FIG. 1 is supplied to and amplified by an amplifier, the non-linear intrinsic characteristics of the amplifier, such as the amplifier's transconductance $G_m$, gate-source capacitance $C_{gs}$, and gate-drain capacitance $G_{gd}$, can cause non-linear distortions to be injected into the amplifier's output signal. Some of the distortions arise due to interactions between the two tones in the input RF signal. These distortions are referred to as intermodulation (IM) distortions. An ideal linear amplifier would not generate IM distortion products in its output.

Figure 2:
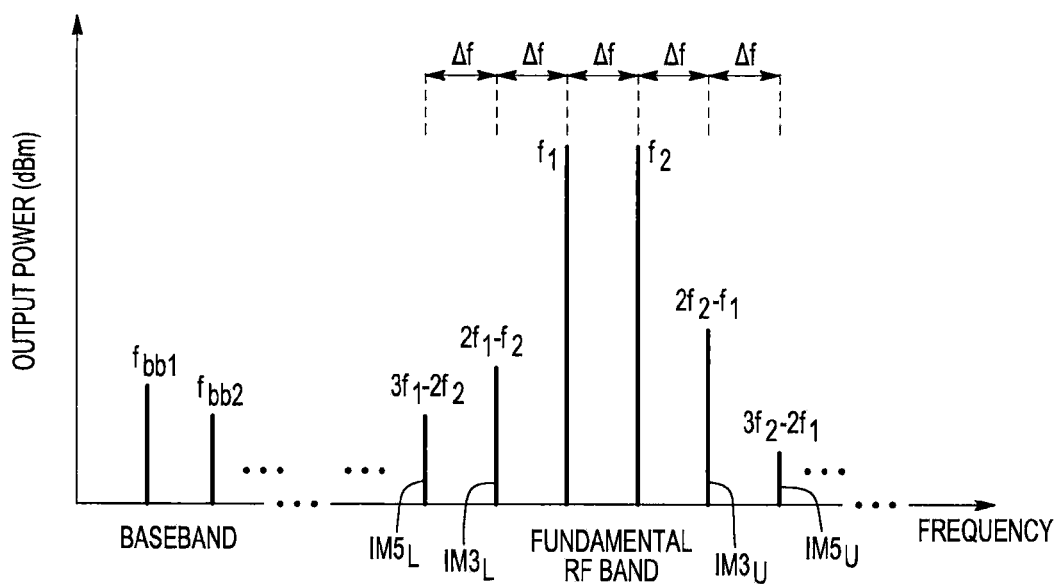
FIG. 2 is a graph illustrating the spectral components of an output signal of an amplifier having amplified the input signal of FIG. 1.

To illustrate these IM distortion products, FIG. 2 is a frequency-domain graph illustrating the spectral components of an output signal of an amplifier having amplified the input signal of FIG. 1. The vertical axis shows output power, while the horizontal axis shows frequency. As shown in FIG. 2, in addition to the output signals having frequencies of $f_1$ and $f_2$ reflecting the upconverted and amplified input signals having base band frequencies $f_{bb1}$ and $f_{bb2}$, additional output signals or IM products are generated at other frequencies. A first set of IM distortion products (labeled IM3$_U$ and IM3$_L$ in FIG. 2) make up a first set of IM distortion product pairs and are referred to as the second order IM products. A second set of IM distortion product pairs referred to as the third order IM products (labeled IM5$_U$ and IM5$_L$ in FIG. 2) are also illustrated. Depending upon the amplifier configuration, many more IM distortion products (not illustrated) may also be generated in the amplifier's output.

In some cases, not only are the IM distortion products generated, reducing the overall linearity and efficiency of the amplifier, but the IM distortion product pairs are not symmetrical in power. As illustrated in FIG. 2, the lower IM3 product IM3$_L$ has a lower output power than the upper IM3 product IM3. Conversely, the lower IM5 product IM5$_L$ has a higher output power than the upper IM5 product IM5$_U$. This asymmetry between IM distortion product pairs can cause additional difficulties in PA linearizability.

The IM distortion elements generated at the output of the power amplifier are generally odd order products (N=3, 5, . . . ) which occur on either side of the fundamental band. Each IM product constitutes a vectorial sum of the higher-order harmonic (harmonic of the fundamental frequency), envelope or baseband and the Nth-order distortion occurring around the fundamental band.

As a specific example, the IM product IM3 is equal to the vectorial sum of the third-order fundamental ($\overline{2f_1-f_2}$ or $\overline{2f_2-f_1}$), the second order envelope ($\overline{f_1-f_2+f_1}$ or $\overline{f_2-f_1+f_2}$), and the second order harmonic ($\overline{2f_1-f_2}$ or $\overline{2f_2-f_1}$). To illustrate, FIG. 3A is a graph depicting the vector combination making up a particular IM product output IM3. The vertical axis shows the imaginary portion of the IM3 product, while the horizontal axis shows the real portion of the IM3 product. As shown, the IM3 product is made up of the three separate vectors, described above. Line 202 shows the third-order fundamental vector, while line 204 shows the second-order harmonic vector, and line 206 shows the second-order envelope vector. The sum of those three vectors results in the IM3 product, depicted by line 208. The greater the magnitude of line 208, the greater the magnitude of the IM product and the corresponding reduction in amplifier linearity and, therefore, efficiency.

As discussed above, not only does the existence of the IM3 product reduce the overall amplifier's efficiency, but asymmetry in power between corresponding IM products, often the product of memory effects within the amplifier, can also reduce an amplifier's performance. FIG. 3B depicts corresponding IM3 products IM3$_L$ and IM3$_U$, where the IM3 products are asymmetrical in power.

The present system and method operates to reduce the distortion in the output of a power amplifier by reducing the magnitude of the amplifier's IM products. Because the IM products are, themselves, the sum of a number of different vector values, by manipulating one of those vectors so as to compensate for the remaining vectors, the magnitude of the amplifier's IM products, as well as their asymmetry, can be managed and reduced.

Figure 3C:
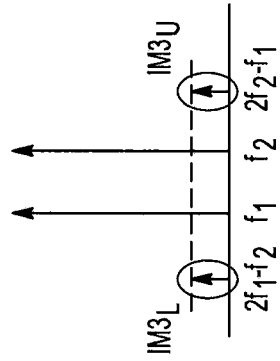
FIG. 3C is a graph depicting the vector values that make up the IM3 product of FIG. 3A, where the envelope vector has been adjusted to reduce the magnitude of the IM3 output.
Figure 3D:
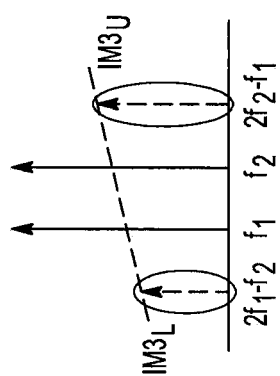
FIG. 3D is a graph illustrating the IM3 products $IM3_L$ and $IM3_U$ when the second-order envelope vector has been adjusted as illustrated in FIG. 3C.
Figure 3A:
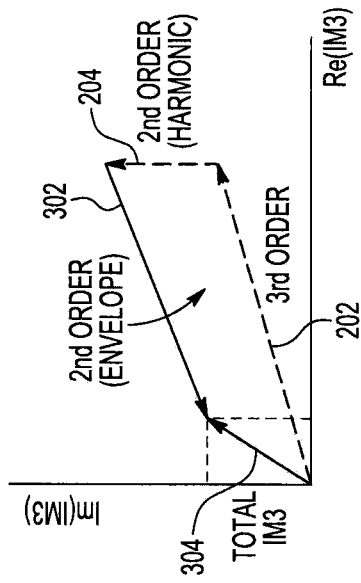
FIG. 3A is a graph depicting the vector combination making up a particular IM product output.
Figure 3B:
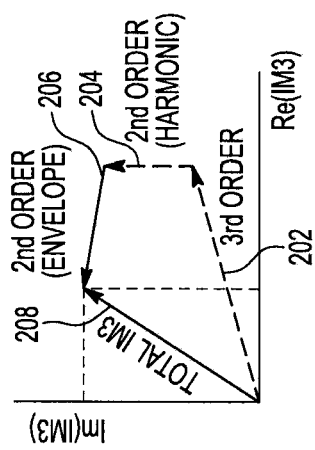
FIG. 3B depicts corresponding IM3 products $IM3_L$ and $IM3_U$, where the IM3 products are asymmetrical.

For example, FIG. 3C is a graph depicting the vector values that make up the IM3 product of FIG. 3A, where the envelope vector has been adjusted to reduce the magnitude of the IM3 output. Referring to FIG. 3C, both the magnitude and phase of the second second-order envelope vector 302 have been adjusted to reduce the magnitude of the IM3 product 304. FIG. 3D shows the corresponding IM3 products IM3$_L$ and IM3$_U$ when the second-order envelope vector has been adjusted as illustrated in FIG. 3C. As shown in FIG. 3D, the result IM3 products are both reduced in magnitude and are more symmetrical in power.

Accordingly, by manipulating one or more envelope signals (and corresponding envelope vector values) being injected into the amplifier, it can be possible to reduce the IM products generated in the output of that amplifier. Generally, the envelope signals being manipulated and injected into the amplifier are determined by the tones present within the input signal to the amplifier. For example, an envelope signal may be generated for each tone present within the input signal. In the present disclosure, solely for purposes of simplifying the discussion a two-tone input signal is described. But it will be apparent to persons of ordinary skill in the art, that the present envelope injection scheme may be utilized to reduce IM products in the outputs of amplifiers amplifying complex digitally modulated signals having more than two tones.

In the specific case of an amplifier having an input signal that is a two-tone RF signal and the two tones correspond to the frequencies $f_1$ and $f_2$, the envelope signals that can be manipulated to minimize particular IM products can be described as follows. To compensate for IM3 output products, the n-order envelope signal is the envelope signal at the frequency $f_2-f_1$ (referred to herein as $f_{bb1}$). For IM5 products, the n-order envelope signal is the envelope signal at the frequency $2*f_{bb1}$. For IM7 products, the n-order envelope signal is the envelope signal at the frequency $3*f_{bb1}$, and so on.

Figure 4:
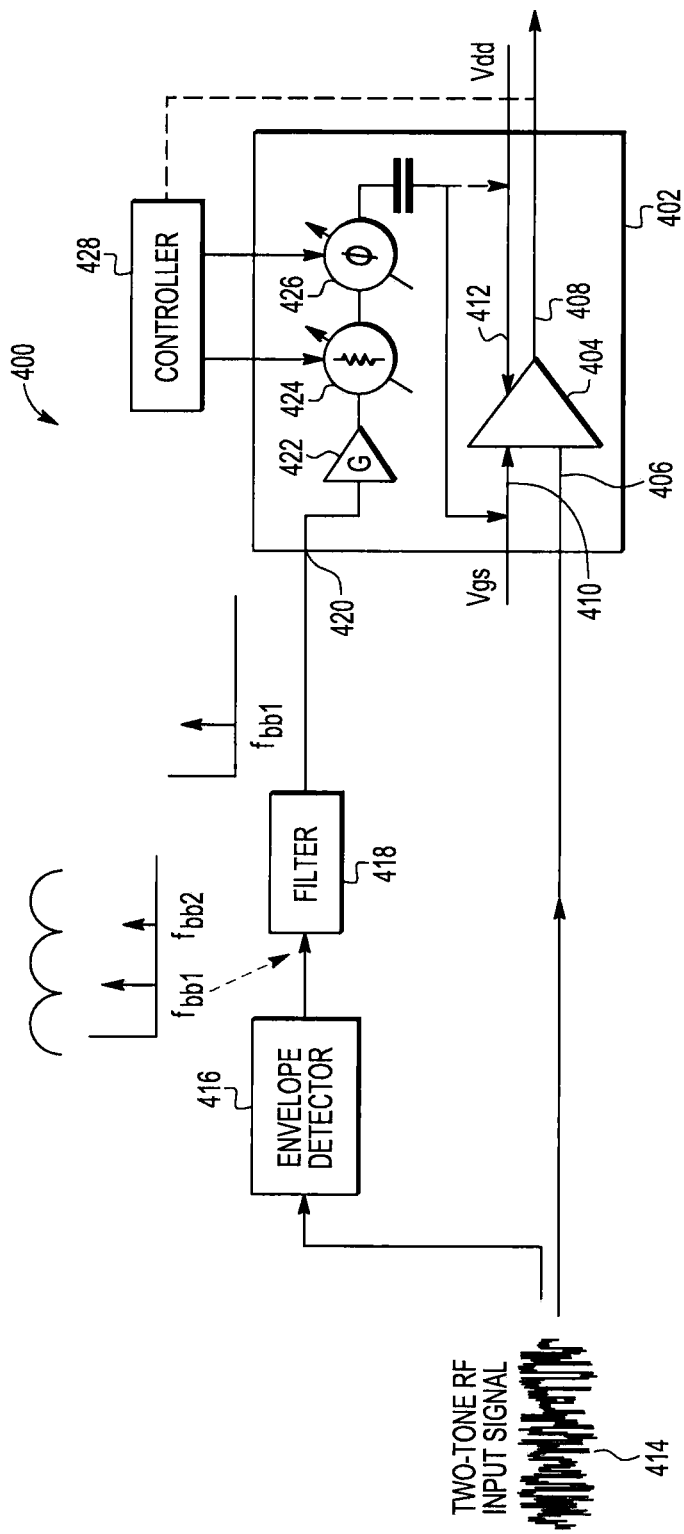
FIG. 4 is a block diagram showing an example amplifier configuration in accordance with the present disclosure.

FIG. 4 is a block diagram showing an example amplifier configuration in accordance with the present disclosure. Device 400 includes power amplifier 402. Power amplifier 402 includes amplifier 404. Amplifier 404 includes an input 406 and an output 408. Additionally, amplifier 404 includes gate bias ($V_{gs}$) 410 and drain supply ($V_{DD}$) 412 inputs. An input signal 414, comprising a two-tone RF input signal at frequencies $f_1$ and $f_2$, is supplied to the input 406 of amplifier 404.

Device 400 includes an envelope detector 416 and a filter 418. Envelope detector 416 is configured to generate an output signal that is equal to the envelope of input signal 414. In this case the input signal is a two-tone signal mathematically represented by the following equation: A1·cos(w1t)+A2·cos(w2t)=2A·cos [((w2−w1)/2)t]·cos [((w2+w1)/2)t] where A1=A2 are the amplitudes of the two-tone signal at angular frequency w1, w2, respectively. From the above equation the two-tone signal contains a carrier signal at (w1+w2)/2 and an envelope signal at (w2−w1)/2. Consequently the envelope detector is configured to eliminate the carrier signal and detect only the envelope signal, which is (w1+w2)/2=Δf in FIG. 1.

Once the envelope signal has been generated by envelope detector 416, filter 418 is configured to filter that envelope signal to generate an output signal equal to an envelope signal having a frequency of one of the baseband products (e.g., $f_{bb1}$, $2*f_{bb2}$, etc.). In one embodiment, filter 418 is a lowpass filter that allows only the envelope signal to pass through. In some embodiments, the bandwidth (BW) of filter 418 is at least three times the operational BW or signal BW of input signal 414. That signal is then supplied to power amplifier 402 via input 420. To compensate for IM3 distortion products, filter 418 would generate an output at the frequency $f_{bb1}$. To compensate for IM5 distortion products, filter 418 would generate an output at the frequency $2*f_{bb2}$.

The envelope signal supplied to input 420 is then amplified by amplifier 422. In various embodiments, amplifier 422 may be an optional buffer amplifier configured to enhance the amplitude of the inputted envelope signal. The magnitude and phase of the envelope signal are then modified by variable attenuator 424 and phase shifter 426. The adjusted envelope signal is then supplied to amplifier 404 via gate bias 410, drain supply 412, or both. Once injected, the adjusted envelop signal is then combined with input signal 406 to optimize the IM3 output products of amplifier 422. To illustrate, FIG. 3C shows how the $2^{nd}$ order envelope 302 is modified (compared to line 206 in FIG. 3A) at the output 408. This modification occurs by injecting an additional envelope signal at the same frequency as that of input signal 406. The amplitude and phase of this additional envelope signal is adjusted suitably to optimize the total IM3 output 304 (see FIG. 3C). In other words, due to the envelope injection, the input signal 406 constitutes not only the two-tone signal but also the injected envelope component.

As discussed above, the envelope signal associated with a particular IM product is one of the vector components that contributes to both the magnitude and phase of a resulting IM distortion product in an amplifier's output. As illustrated by FIGS. 3A and 3C, by manipulating the magnitude and phase of the envelope signal, it is possible to both reduce the magnitude of the corresponding IM products, as well as increase the symmetry of those IM products. Controller 428, therefore, is configured to manipulate the magnitude and phase of the envelope signal received via input 420 so as to reduce the magnitude of and increase the symmetry of the IM products generated in the output of amplifier 404.

In various embodiments of device 400, variable attenuator 424 is digitally controlled by an input provided by controller 428. Variable attenuator 424 has a plurality of attenuation levels where the attenuation levels are separated by a number of decibels (dB)—in one example 0.5 dB separates the attenuation levels. While digitally controlled, variable attenuator 424 in some embodiments can be an analog attenuator. In various embodiments of device 400, phase shifter 426 is digitally controlled by an input provided by controller 428. Phase shifter 426 has a plurality of states resulting in various levels of phase shift. In one example, the phase shifted states can be separated by approximately 6.5 degrees, although the separation may be larger or smaller, as well. While digitally controlled, phase shifter 426 in some embodiments can be an analog phase shifter.

By manipulating the attenuation of variable attenuator 424 and phase shift of phase shifter 426, controller 428 can adjust the magnitude and phase of the envelope signal supplied to amplifier 404 via either or both of gate bias 410 and drain supply 412. In general, controller 428 is configured to manipulate the magnitude and phase of the envelope signal to both minimize the magnitude of IM products generated by amplifier 404, and increase the symmetry of the those products.

To do so, controller 428 can be configured to receive a feedback signal from the output of amplifier 404. Controller 428 may then analyze the feedback signal to identify the IM products in the output of amplifier 404. Controller 428 can then, based upon those identified IM products, determine an optimum configuration for both variable attenuator 424 and phase shifter 426 for modifying the envelope signal supplied to amplifier 404 so as to minimize and make more symmetrical one or more of those IM products. One method to obtain optimized attenuation and phase shift settings that may be implemented by controller 428 involves fixing the attenuation of variable attenuator 424 to a minimum value and sweeping the phase shift applied by phase shifter 426 until the IM products present in the feedback signal reaches lowest values. Once identified, that phase shift can be fixed in phase shifter 426 and the attenuation applied by variable attenuator 424 can be swept and the phase shifter 426 could be again swept to identify increasingly optimized settings to reduce overall IM product output. This process can be repeated until controller 428 detects the lowest achievable IM product in the feedback signal.

Where power amplifier 402 is configured to receive a single envelope input signal, device 400 may be configured to only provide compensation for the IM3 IM products. In that case, the envelope signal supplied as an input to power amplifier 402 at input 420 will include a filtered envelope signal at the frequency $f_{bb1}$. But, as described below, additional envelope signals for different frequencies associated with different IM products may also be separately supplied to power amplifier 402, modified in both amplitude and phase, and supplied to either or both of gate bias 410 and drain supply 412 of amplifier 404 to provide compensation for other IM products.

In other embodiments of device 400, rather than performing envelope detection and filtering of the RF input signal 414 (e.g., as performed by envelope detector 416 and filter 418), the desired envelope signals may be generated directly from the baseband signal used to generate the RF input signal. In that case, a separate component, such as a baseband and digital to analog converter (DAC) can generate the desired envelope signals, which can be supplied separately to power amplifier 402.

A specific type of amplifier that can be used in a number of wireless applications is a Doherty amplifier. Doherty amplifiers can, in some cases, enable high efficiency over a wide output power range and can achieve a desired linearity using various linearization schemes. In many implementations, Doherty amplifiers include two amplifiers—a carrier or main amplifier, and a peaking amplifier. In a symmetric Doherty amplifier, the carrier and peaking amplifiers are the same size. Asymmetric Doherty amplifiers employ a peaking amplifier that is larger than the carrier amplifier and offer the potential for additional efficiency improvements.

In a Doherty amplifier, an input signal is split at an input or power splitter between the carrier and peaking amplification paths or circuits. The split signals are then separately amplified by the carrier and peaking amplifiers of the Doherty amplifier and combined at an output stage.

Figure 5:
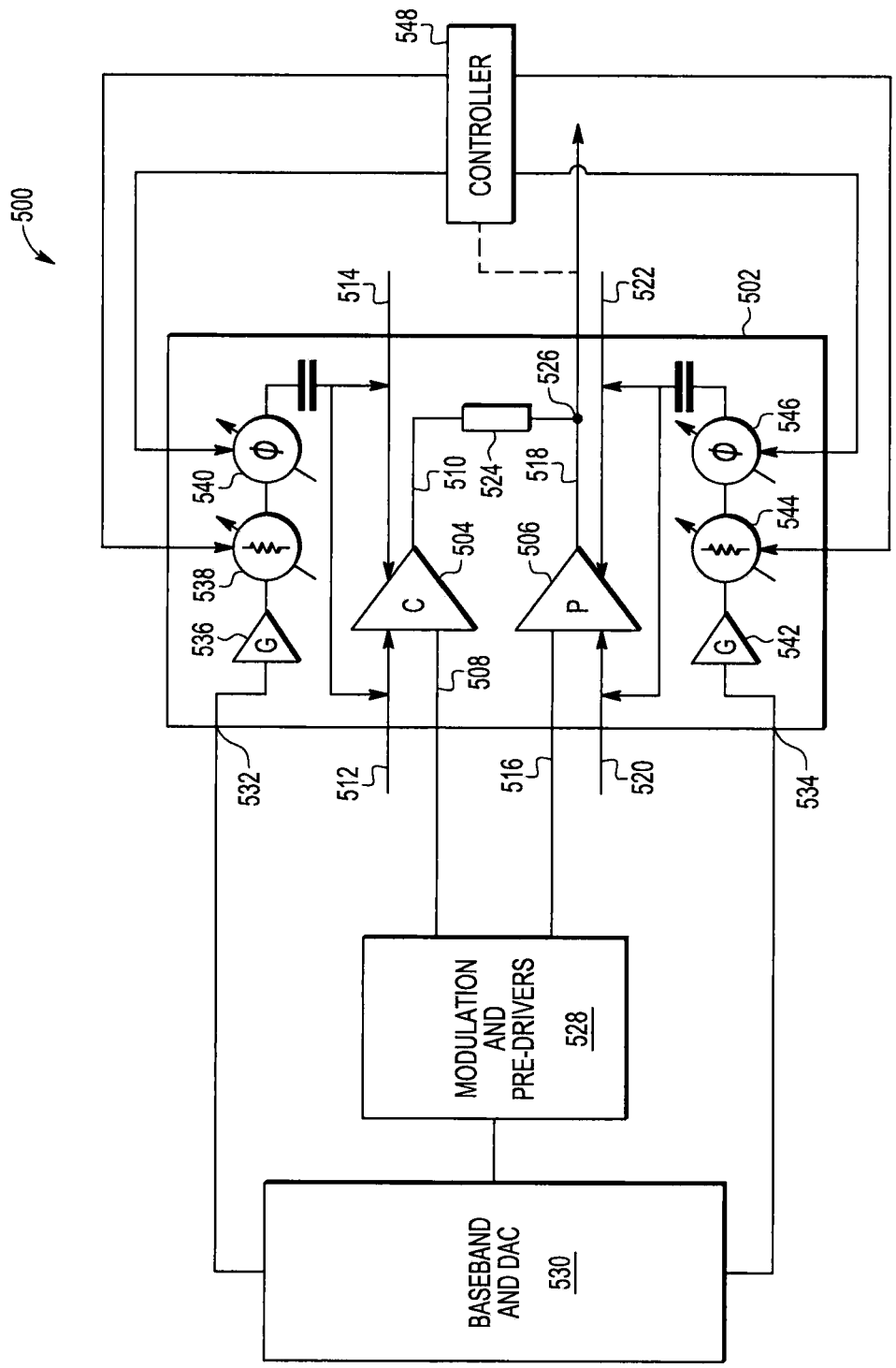
FIG. 5 is a block diagram illustrating a device incorporating a Doherty amplifier, where the device is configured to reduce IM output products.

FIG. 5 is a block diagram illustrating a device incorporating a Doherty amplifier, where the device is configured in accordance with the present disclosure. Device 500 includes Doherty amplifier 502. Doherty amplifier 502 includes carrier amplifier 504 and a peaking amplifier 506. Carrier amplifier 504 has an input 508, output 510, gate bias 512 and drain supply 514. Peaking amplifier 506 has an input 516, output 518, gate bias 520 and drain supply 522. As will be appreciated by those of ordinary skill based on the description herein, the carrier and peaking amplifiers 504 and 506 may include one or more stages of relatively low power level amplification and relatively high power level amplification.

Doherty amplifier 502 may operate as a symmetrical Doherty amplifier, in which case the input signals to both carrier amplifier 504 and peaking amplifier 506 are very similar with, in some embodiments, equal power. In other cases, though, the input signals to carrier amplifier 504 and peaking amplifier 506 have unequal power.

An impedance inverter or a λ/4 transmission line phase shift element 524 is connected between the output 510 of carrier amplifier 504, and the output 518 of peaking amplifier 506 via summing node 526. The phase shift introduced by element 524 is, in some implementations, compensated by a 90 degree relative phase shift introduced at the input 516 of peaking amplifier 506. Alternatively, Doherty amplifier 502 may have an "inverted Doherty" configuration. In such a configuration, an impedance inverter or λ/4 line phase shift element is connected between the output of peaking amplifier 506 and the summing node 526, rather than being connected between the output 510 of carrier amplifier 504 and the summing node 526.

The outputs of carrier amplifier 504 and peaking amplifier 506 are combined at combiner node 526. An impedance network, not shown, is connected to combiner node 526 and operates to present the proper load impedances to each of carrier amplifier 504 and peaking amplifier 506. The impedance network may include a suitably configured transmission line or impedance transformer and output network, where the transmission line or impedance transformer has an impedance selected to match the impedance of Doherty amplifier 502 to the desired load.

Doherty amplifier 502 is configured so that the carrier amplifier 504 provides the amplification for lower level input signals, and both amplifiers 504 and 506 operate in combination to provide the amplification for high input level signals. This may be accomplished, for example, by biasing the carrier amplifier 504, such that the carrier amplifier 504 operates in a class AB mode, and biasing the peaking amplifier 506 such that the peaking amplifier 506 operates in a class C mode.

The input signals to carrier amplifier 504 and peaking amplifier 506 are supplied by modulation and pre-driver 528 circuitry. Modulation and pre-driver circuitry 528 may include one or more signal splitters, either symmetrical or asymmetrical, coupled to a pre-amplifier and is configured to receive an input baseband RF signal. Modulation and pre-driver 528 circuitry modulates and upconverts the input baseband RF signal and splits the modulated and upconverted signal into two signals that become the inputs to each of carrier amplifier 504 and peaking amplifier 506.

Modulation and pre-driver module 528 receives an input from baseband and digital-to-analog conversion (DAC) module 530. Baseband and digital-to-analog conversion module 530 is configured to receive an input digital signal comprising the data to be transmitted by Doherty amplifier 502. That digital signal is then converted into an analog signal suitable for transmission at the baseband frequency.

As illustrated, baseband and digital-to-analog conversion module 530 is configured to also output two envelope signals, which are supplied to inputs 532 and 534 of Doherty amplifier 502. As discussed above, the envelope signals can be generated by generating an envelope signal of the base band signal, and then filtering that envelope signal to generate a filtered envelope signal about a target frequency. The target frequency is selected to correspond with a particular IM output product of Doherty amplifier 502. For example, if device 500 is to be configured to minimize the IM3 output distortion, the selected frequency of the envelope signal supplied at inputs 532 and 534 of Doherty amplifier 502 will be $f_{bb1}$. Similarly, to minimize IM5 output distortion, the selected frequency of the envelope signals would correspond to $2*f_{bb1}$, and so on.

Although FIG. 5 illustrates the envelope signals being generated by an analysis of device 500 baseband signal, as discussed above with reference to FIG. 4, the desired envelope signals could be generated by performing envelope detection and filtering on an input signal to Doherty amplifier 502 (e.g., by analyzing one or more outputs from modulation and pre-drivers 528).

The envelope signal provided at input 532 is then amplified by amplifier 536 and the magnitude and phase of the envelope signal is adjusted by variable attenuator 538 and variable phase shifter 540 so as to minimize the IM distortion product corresponding to the frequency of the envelope signal at the output from carrier amplifier 504. That modulated envelope signal is then supplied to carrier amplifier 504 at either gate bias 512, drain supply 514, or both. Similarly, the envelope signal provided at input 534 is then amplified by amplifier 542 and the magnitude and phase of the envelope signal is adjusted by variable attenuator 544 and variable phase shifter 546 so as to minimize the IM distortion product corresponding to the envelope signal at the output from peaking amplifier 506. That modulated envelope signal is then supplied to peaking amplifier 506 at either gate bias 520, drain supply 522, or both.

Each of variable attenuators 538 and 544 and phase shifters 540 and 546 are controlled by input control signals supplied by controller 548. The control signals supplied by controller 548 are configured to reduce the IM products generated in the outputs of carrier amplifier 504 and peaking amplifier 506 that correspond to the envelope signals supplied at inputs 532 and 534.

In one embodiment, controller 548 can be configured to receive a feedback signal from the output of Doherty amplifier 502. A single feedback signal may be supplied from summing node 526, or separate feedback signals may be supplied from the outputs of each of carrier amplifier 504 and peaking amplifier 506. Having received the feedback signal(s), controller 548 may then be configured to analyze the feedback signal(s) to identify the IM products in the output of Doherty amplifier 502. Controller 548 can then, based upon those identified IM products, determine an optimum configuration for both variable attenuators 538 and 544 and phase shifters 540 and 546 for modifying the envelope signals supplied to each of carrier amplifier 504 and peaking amplifier 506 so as to minimize and make more symmetrical one or more of the IM products generated in the outputs of carrier amplifier 504 and peaking amplifier 506.

Device 500 illustrated in FIG. 5 is configured to supply a single envelope signal to each of carrier amplifier 504 and peaking amplifier 506 of Doherty amplifier 502 and may be used to correct a single IM product in the output of each of the amplifiers of Doherty amplifier 502. As discussed above, however, the embodiment can be extended to correct or reduce additional IM products (e.g., IM3, IM5, IM7, IM9, etc.) that may be present in the output of an amplifier.

Figure 6:
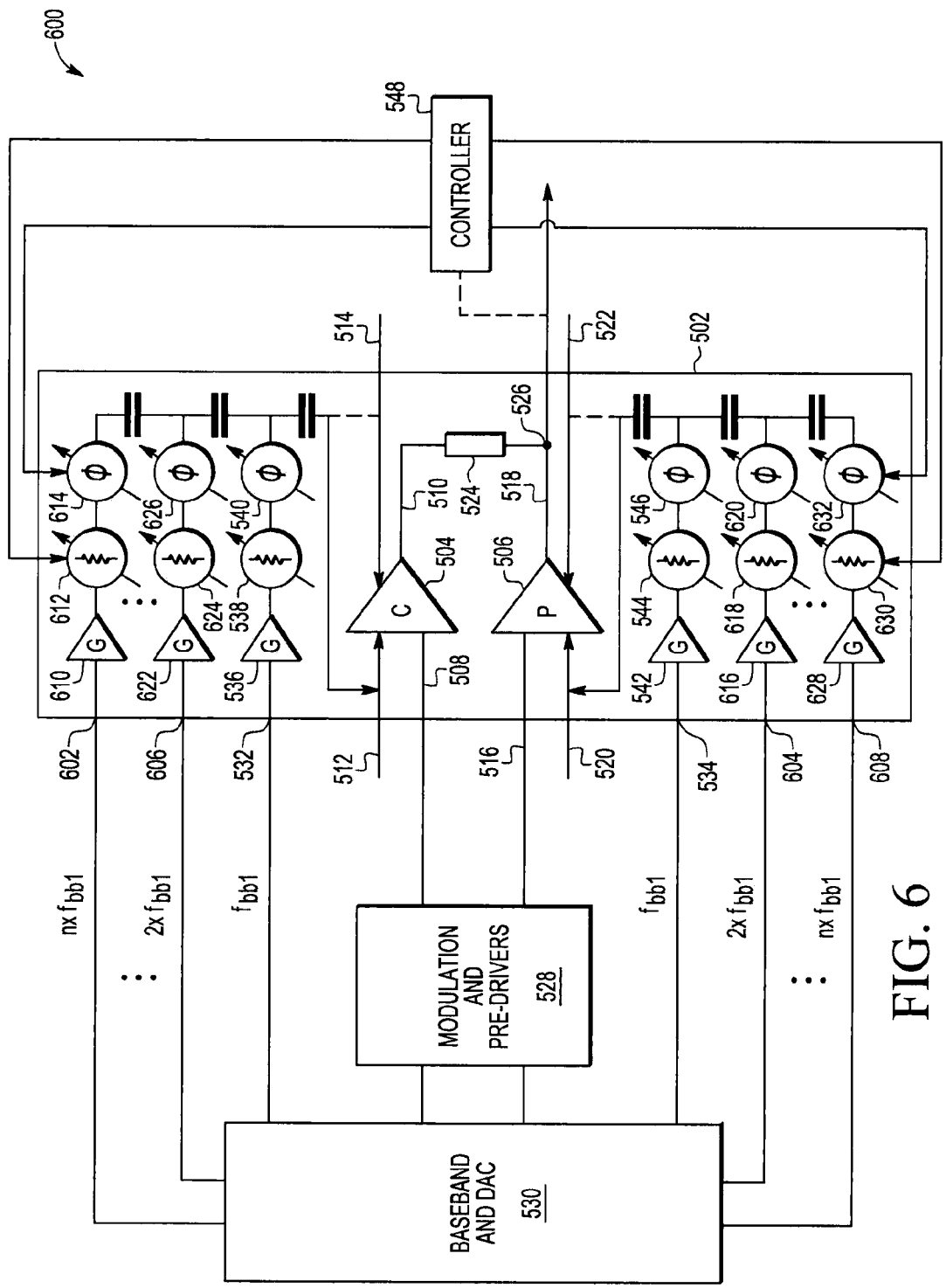
FIG. 6 is a block diagram showing the device of FIG. 5 modified to provide for IM correction for multiple IM products generated by each of a carrier amplifier and a peaking amplifier.

To illustrate, FIG. 6 is a block diagram showing device 500 of FIG. 5 modified to provide for IM correction for multiple IM products generated by each of carrier amplifier 504 and peaking amplifier 506. As shown in FIG. 6, baseband and digital-to-analog conversion module 530 is configured to generate a number of output envelope signals. The envelope signals can be generated using any of the approaches described above, including performing envelope detection on the baseband signal and filtering for a target frequency or similar analysis performed on an input signal to Doherty amplifier 502.

The envelope signals are supplied to Doherty amplifier 502 at a number of inputs 532, 534, 602, 604, 606, and 608. As described above, each envelope signal supplied to Doherty amplifier 502 is associated with a particular IM product and is, therefore, centered at one of the frequencies $f_{bb1}$, $2*f_{bb1}$, $3*f_{bb1}$, etc. The envelope signals may be symmetrical, so that the signals supplied to carrier amplifier 504 at inputs 532, 606, and 602 are the same as the envelope signals supplied to peaking amplifier 506 at inputs 534, 604, and 608. Or, alternatively, the envelope signals may not be symmetrical, so that different envelope signals associated with different IM products are supplied to inputs 532, 606, and 602 and inputs 534, 604, and 608. As shown in the example of FIG. 6, inputs 534 and 532 receive an envelope signal at frequency $f_{bb1}$, inputs 606 and 604 receive an envelope signal at frequency $2*f_{bb1}$, and inputs 602 and 608 receive an envelope signal at frequency $n*f_{bb1}$.

Each envelope signal is then amplifier by its respective amplifier (e.g., amplifiers 536, 622, 610, 542, 616, and 628) and controller 548 is configured to adjust the connected variable attenuators 538, 624, 612, 544, 618, and 630 and phase shifters 540, 626, 614, 546, 620, and 632 to adjust the envelope signals being insert to carrier amplifier 504 and peaking amplifier 506 to minimize the IM products thereof.

The present disclosure, therefore, provides systems and methods for potentially reducing or minimizing the IM products of an amplifier, such as the carrier amplifier and peaking amplifier of a Doherty amplifier. Or, in the case of an n-way Doherty amplifier that includes a carrier amplifier and two or more peaking amplifiers, the present system and method may be used to reduce the IM products of the carrier amplifier as well as the two or more peaking amplifiers.

The present device may be implemented in a single package that provides IM product compensation. By controlling the magnitude and phase of the baseband multi-tone injected envelope signals, asymmetry in IM3, IM5 and even higher order distortion products can be minimized for various applications. The resulting amplifier may have enhanced raw linearity, allowing the amplifier to be driven harder providing higher system efficiency. The improved amplifier linearity may also provide improved DPD correction capability for broadband modulated signals potentially further improvement system efficiency.

An embodiment of a device includes an amplifier having an output, and at least one of a gate bias input and a drain supply input. The amplifier is configured to receive an input signal and output an amplified signal at the output of the amplifier. The device includes an input configured to receive an envelope signal. The input is connected to the at least one of the gate bias input and the drain supply input and the envelope signal is at least partially determined by an attribute of the input signal to the amplifier. The device includes a controller configured to modify at least one of an amplitude and a phase of the envelope signal to reduce a magnitude of an intermodulation distortion product of the amplifier.

An embodiment of a device includes an amplifier having an output, and at least one of a gate bias input and a drain supply input. The amplifier is configured to receive an input signal and output an amplified signal at the output of the amplifier. The device includes an input configured to receive an envelope signal. The input is connected to the at least one of the gate bias input and the drain supply input and the envelope signal is at least partially determined by an attribute of the input signal to the amplifier. The device includes a variable attenuator connected to the input and configured to modify an attenuation of the envelope signal, and a phase shifter connected to the input and configured to modify a phase shift of the envelope signal. The device includes a controller configured to modify at least one of the variable attenuator and the phase shifter to reduce a magnitude of an intermodulation distortion product of the amplifier.

An embodiment of a method includes receiving an envelope signal. The envelope signal is at least partially determined by an attribute of an input signal to an amplifier. The method includes modifying at least one of an amplitude and a phase of the envelope signal to reduce a magnitude of an intermodulation distortion product of the amplifier, resulting in a modified envelope signal. The method includes supplying the modified envelope signal to at least one of a gate bias input and a drain supply input of the amplifier.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A device, comprising:
    an amplifier having an output, and at least one of a gate bias input and a drain supply input, the amplifier being configured to receive an input signal and output an amplified signal at the output of the amplifier;
    an input configured to receive an envelope signal, the input being connected to the at least one of the gate bias input and the drain supply input and the envelope signal being at least partially determined by an attribute of the input signal to the amplifier;
    a second input configured to receive a second envelope signal having a frequency equal to twice a frequency of the envelope signal, the second input being connected to the at least one of the gate bias input and the drain supply input; and
    a controller, the controller being configured to:
        modify at least one of an amplitude and a phase of the envelope signal to reduce a magnitude of an intermodulation distortion product of the amplifier, and
        modify at least one of a second amplitude and a second phase of the second envelope signal to reduce a second magnitude of a second intermodulation distortion product of the amplifier, the second intermodulation distortion product being different from the intermodulation distortion product.

2. The device of claim 1, wherein the input signal is a two-tone radio frequency signal having two energy peaks at frequencies $f_1$ and $f_2$.

3. The device of claim 2, wherein the envelope signal is at a frequency equal to $n*(f_2-f_1)$.

4. The device of claim 1, including a second amplifier configured to amplify the envelope signal received at the input.

5. The device of claim 1, wherein the controller is configured to receive a feedback signal, the feedback signal being at least partially determined by an output signal of the amplifier.

6. The device of claim 1, wherein the amplifier is a Doherty amplifier.

7. The device of claim 1, wherein the envelope signal has a frequency equal to a first baseband product of the input signal, and the second envelope signal has a frequency equal to twice the frequency of the envelope signal.

8. The device of claim 1, wherein the device is formed in a single package.

9. A device, comprising:
- an amplifier having an output, and at least one of a gate bias input and a drain supply input, the amplifier being configured to receive an input signal and output an amplified signal at the output of the amplifier;
- an input configured to receive an envelope signal, the input being connected to the at least one of the gate bias input and the drain supply input and the envelope signal being at least partially determined by an attribute of the input signal to the amplifier;
- a variable attenuator connected to the input and configured to modify an attenuation of the envelope signal;
- a phase shifter connected to the input and configured to modify a phase shift of the envelope signal;
- a second input configured to receive a second envelope signal different from the envelope signal, the second input being connected to the at least one of the gate bias input and the drain supply input, the envelope signal having a frequency equal to a first baseband product of the input signal, and the second envelope signal having a frequency equal to a multiple of the frequency of the envelope signal; and
- a controller, the controller being configured to modify at least one of the variable attenuator and the phase shifter to reduce a magnitude of an intermodulation distortion product of the amplifier.

10. The device of claim 9, wherein the input signal is a two-tone radio frequency signal having two energy peaks at frequencies $f_1$ and $f_2$.

11. The device of claim 10, wherein the envelope signal is at a frequency equal to $n*(f_2-f_1)$.

12. The device of claim 9, including a second amplifier configured to amplify the envelope signal received at the input.

13. The device of claim 9, wherein the controller is configured to receive a feedback signal, the feedback signal being at least partially determined by an output signal of the amplifier.

14. The device of claim 9, wherein the amplifier is a Doherty amplifier.

15. The device of claim 9, wherein the device is formed in a single package.

16. A method, comprising:
- receiving an envelope signal, the envelope signal being at least partially determined by an attribute of an input signal to an amplifier;
- receiving a second envelope signal, the envelope signal having a frequency equal to twice a frequency of the envelope signal;
- modifying at least one of an amplitude and a phase of the envelope signal to reduce a magnitude of an intermodulation distortion product of the amplifier, resulting in a modified envelope signal;
- modifying at least one of a second amplitude and a second phase of the second envelope signal to reduce a second magnitude of a second intermodulation distortion product of the amplifier, resulting in a second modified envelope signal; and
- supplying the modified envelope signal and the second modified envelope signal to at least one of a gate bias input and a drain supply input of the amplifier.

17. The method of claim 16, wherein the input signal is a two-tone radio frequency signal having two energy peaks at frequencies $f_1$ and $f_2$.

18. The method of claim 17, wherein the envelope signal is at a frequency equal to $n*(f_2-f_1)$.

19. The method of claim 16, wherein modifying at least one of an amplitude and a phase of the envelope signal includes modifying at least one of variable attenuator and phase shifter connected to the at least one of the gate bias input and the drain supply input of the amplifier.

* * * * *